United States Patent [19]
Luo

[11] Patent Number: 6,111,467
[45] Date of Patent: Aug. 29, 2000

[54] CIRCUIT FOR TIME CONSTANT TUNING OF GM-C FILTERS

[75] Inventor: Lijun Luo, Singapore, Singapore

[73] Assignee: Tritech Microelectronics, Ltd., Singapore, Singapore

[21] Appl. No.: 09/072,340

[22] Filed: May 4, 1998

[51] Int. Cl.[7] .................................................. H03F 3/191
[52] U.S. Cl. ........................................ 330/305; 327/554
[58] Field of Search .................................. 330/9, 51, 69, 330/85, 141, 281, 305; 327/337, 554

[56] References Cited

U.S. PATENT DOCUMENTS

| | | | |
|---|---|---|---|
| 5,325,070 | 6/1994 | McGinn | 330/256 |
| 5,384,501 | 1/1995 | Koyama et al. | 327/336 |
| 5,559,470 | 9/1996 | Laber et al. | 330/252 |
| 5,572,163 | 11/1996 | Kimura et al. | 330/305 X |
| 5,621,355 | 4/1997 | Williams et al. | 327/554 X |

*Primary Examiner*—Steven J. Mottola
*Attorney, Agent, or Firm*—George O. Saile; Stephen B. Ackerman

[57] ABSTRACT

This invention is an electronic time constant tuning circuit that uses a frequency of a clock to tune the circuit time constant. A first transconductor is used to charge a capacitor to two different voltages, each for a separate portion of a clock period. A second transconductor is used to compare the two voltages and control them to be equal by controlling the transconductance of the first transconductor. When the two voltage are equal, the resulting transconductance and the capacitance of the capacitor form the circuit time constant. The circuit time constant can readily be changed by changing the frequency of the clock. The control signal generated by the second transconductor can be applied to other transconductors in a gm-C filter to adjust the cutoff frequency of the filter when the other transconductors have a similar structure to the first transconductor.

11 Claims, 6 Drawing Sheets

CIRCUIT FOR TIME CONSTANT TUNING OF GM-C FILTERS

BACKGROUND OF THE INVENTION

1. Field of Invention

This invention relates to electronic filters and in particular the tuning of gm-C filters

2. Description of Related Art

Filters using transconductors and capacitors are often called "gm-C" filters. A transconductor is a circuit that has a voltage as an input and a current as an output. Most of the integrated gm-C filters use transconductance tuning or transconductance fixing with an external precision resistor. This method of tuning does not provide any compensation for process variations of the on chip capacitors; and therefore, the filter tire constant is not process independent. There exists other methods of time constant tuning using phase locked loops that can keep the time constant tuning process independent, but these methods use analog circuits which require large silicon surfaces to implement and dissipate large amounts of power.

In U.S. Pat. No. 5,325,070 (McGinn) a transconductance gain amplifier is described that reduces the effects of temperature changes of on-chip resistors on the amplifier cut off frequency. In U.S. Pat. No. 5,384,501 (Koyama et al.) a differential amplifier is described in which a variable resistance in the form of a field effect transistor is connected between the differential input pair of the amplifier to provide a means to change the transconductance and the time constant of the differential amplifier. In U.S. Pat. No. 5,559,470 (Laber et al.) a high frequency continuous time filter using an active integrator and a transconductor stage is described which is insensitive to process variations and parasitic capacitance. The filter uses an external precision resistor to set the transconductance and a poly-fuse wafer-sort trim technique to remove capacitor process tolerances.

A simple method to achieve time constant tuning that is independent of process variations is needed that uses a variable mechanism that is independent of the circuitry producing the tuned time constant. The before mentioned prior art uses external resistance to adjust for process variations and to set the transconductance of the circuitry. An entirely integrated solution in which the transconductance and circuit time constant can be tuned by varying an external signal provides a way to achieve the tuning independent of process and process variations. To this end, the technique described in this invention provides a means to accomplish time constant tuning using simple circuitry without the use of phase locked loops, or test time intensive poly-silicon fuse trimming.

SUMMARY OF THE INVENTION

In this invention an input voltage to a first transconductor produces an output current $I_{out}=gm \times V_{in}$. Where gm is the transconductance of the first transconductor. The output current is used to charge for one clock period a capacitor contained in the feedback loop of a current summing operational amplifier (op. amp.). The capacitor is charged to two different voltages in two different clock periods, and these voltages are compared in a second transconductor. The output signal of the second transconductor is used to control the gm of the first tranconductor such that the two voltages are equal. This establishes the time constant, C/gm, of the circuit, where C is the capacitance of the feedback capacitor of the operational amplifier. The transconductance of the circuit can be changed by changing the clock frequency and thus changing the time period that the capacitor is allowed to be charged. The circuit adjusts the gm of the first transconductor so that the two voltages from the feedback capacitor are again equal and the new gm in combination with the capacitance of the feedback capacitor produces a new circuit time constant.

The circuit of this invention contains three improvements over other similar circuits. First, parasitic capacitance at the output of the first transconductor is discharged before voltage integration of the feedback capacitor is done. This prevents a transfer of charge from the parasitic capacitors to the feedback capacitor during voltage integration. Second, a grounded voltage source is used to establish a starting voltage reference on the feedback capacitor for the second voltage integration which is much simpler to provide. Third, a transconductor is used in the negative feedback loop to control the gm of the first transconductor. This is an improvement over using a high gain differential amplifier because the feedback loop can be open at times making the effective negative feedback control with a high gain operational amplifier difficult to achieve.

In the operation of the circuit of this invention the parasitic capacitance at the output of the first transconductor is discharged to ground, and the feedback capacitor of the current summing operational amplifier is discharged. A first input voltage is connected to the first transconductor and signal ground is connected to the (+) input to the current summing operational amplifier. The output of the first transconductor is connected to the (−) input terminal of the current summing operational amplifier for one half a clock period to charge the capacitor in the feedback loop of the operational amplifier to a first voltage. After a half clock period the output of the first transconductor is disconnected from the current summing operational amplifier, and the first voltage on the feedback capacitor is sampled and held. The parasitic capacitance at the output of the first transconductor is again discharged to ground, and the feedback capacitor of the current summing operational amplifier is discharged.

A second input voltage is next connected to the input of the first transconductor and a reference voltage is connected to the (+) terminal of the operational amplifier. The output of the first transconductor is connected to the (−) input terminal of the current summing operational amplifier for a half clock period to charge the capacitor in the feedback loop of the operational amplifier to a second voltage. After a half clock period the output of the first transconductor is disconnected from the current summing operational amplifier, and the second voltage on the feedback capacitor is sampled and held. The first and second voltages sampled and held are compared in a second transconductor. The output of the second transconductor controls the transconductance (gm) of the first transconductor such that the two sample and hold voltages are controlled to be equal. The control voltage generated by the second transconductor is applied to tune transconductors employed in a gm-C filter which have the same structure and characteristics as the first transconductor.

When the two sample and hold voltages are equal: $V_{D1}=V_{D2}$ where $$V_{D1} = \frac{gm}{C} k_1 V_R \frac{T}{2} - \frac{I_{off}}{C} \frac{T}{2} + V_{off} \text{ and}$$

$$V_{D2} = \frac{gm}{C} k_2 V_R \frac{T}{2} - \frac{I_{off}}{C} \frac{T}{2} - V_R + V_{off}.$$

tranconductance of the first tranconductor is gm. The feedback capacitance of the current summing operational amplifier is C. The first input voltage to the first transconductor is $k_1 V_R$, and the second input voltage to the first transconductor is $k_2 V_R$. The period of the clock is T. The reference voltage applied to the (+) terminal of the current summing operational amplifier is $-V_R$. The offset current at the output of the first transconductor is $I_{off}$, and the offset voltage of the operational amplifier is $V_{off}$. Equating the two sample and hold voltages yields:

$$\frac{C}{gm} = (k_1 - k_2)\frac{T}{2} \text{ where } \frac{C}{gm}$$

is the time constant of the circuit. Both the offset current and the offset voltage are canceled out, and the circuit time constant is a finction of the period of the clock and the two multiplication factors of the input voltages to the first transconductor. Changing the frequency of the clock changes the clock period T, and results in a new gm that produces a new circuit time constant.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
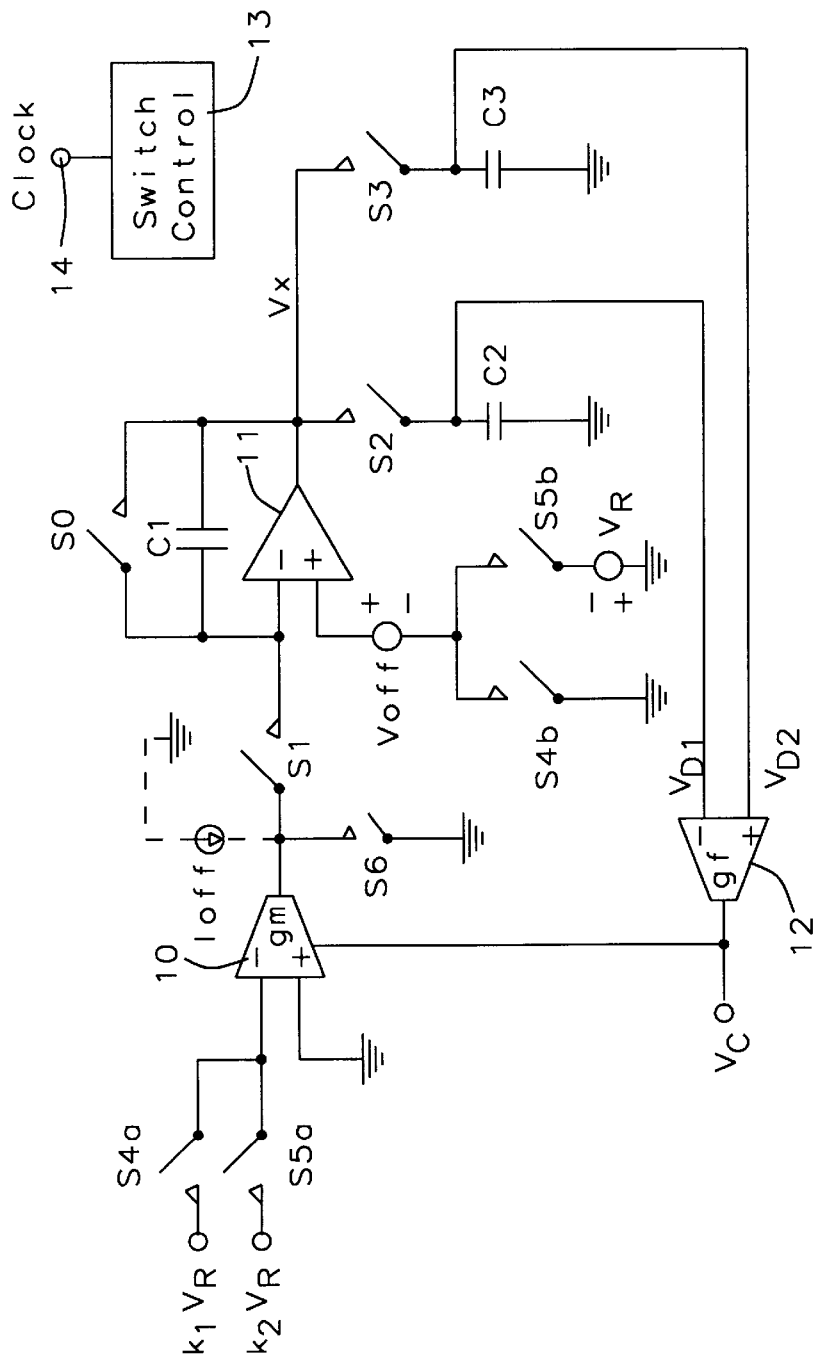
FIG. 1 is a schematic diagram of the time constant tuning circuit.

In FIG. 1 is shown a time constant tuning circuit. Connected to the (−) input of a transconductor 10 is a voltage $k_1 V_R$ through switch S4a and a voltage $k_2 V_R$ through switch S5a. The transconductance of the transconductor 10 is gm. Connected to the output of the tranconductor 10 is a negative (−) input of a current summing operational amplifier 11 through a switch S1. Also connected to the output of the transconductor is a switch S6 to circuit ground and an offset current $I_{off}$. The offset current is not a physical current supply but represents an offset in the transconductor 10 output current.

Continuing to refer to FIG. 1, in the feedback path of the operational amplifier 11 between the output and the (−) input terminal is a capacitor C1 connected in parallel with a switch S0. Shown connected to the positive (+) input of the operational amplifier 11 is an offset voltage $V_{off}$. The offset voltage $V_{off}$ is not a physical voltage supply, but represents any input voltage offset of the operational amplifier 11. Connected to the (+) input to the operational amplifier 11 through this representative offset voltage is ground through switch S4b and a reference voltage $-V_R$ through switch S5b. The output voltage $V_x$ of the operational amplifier 11 is connected to a capacitor C2 to ground through switch S2 and capacitor C3 to ground through switch S3.

Continuing to refer to FIG. 1, voltage $V_{D1}$ on capacitor C2 is connected to the negative (−) input terminal of a feedback transconductor 12, and voltage $V_{D2}$ on capacitor C3 is connected to the positive (+) input terminal of the feedback transconductor 12. The output of the feedback transconductor 12 produces a control voltage $V_C$ that is used to control the transconductance gm of the transconductor 10. A switch control unit 13 is used to sequence and control the switches in the circuit. A clock 14 is used to establish the basic duration of the timing of the switches and defines the length of time the feedback capacitor C1 is allowed to be charged by the output current of transconductor 10.

Figure 2:
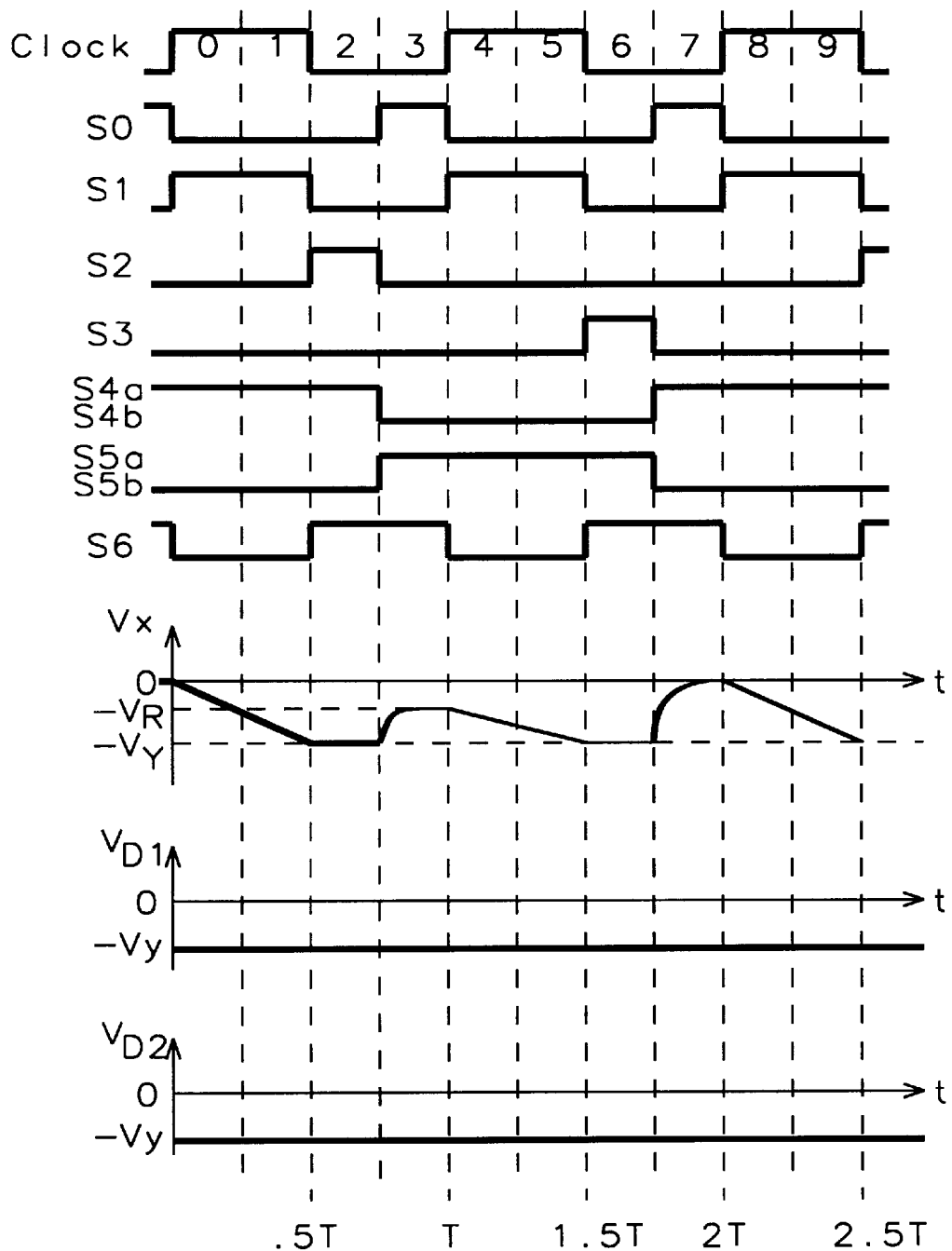
FIG. 2 is timing diagram of waveforms of the time constant tuning circuit.

Referring to FIG. 2 along with FIG. 1, a set of switch timings and voltage waveforms are shown. The timing is broken up into one quarter clock periods and each period is numbered 0 through 9 along the clock signal at the top of FIG. 2. During quarter periods 0 and 1, switch S4a that connects the input voltage $k_1 V_R$ to the transconductor 10 is closed, and switch S4b that connects signal ground to the (+) input of the current summing operational amplifier is closed. Switch S1 is closed for quarter periods 0 and 1 to connect the output of the transconductor 10 to the operational amplifier 11 which allows the feedback capacitor C1 to be charged from zero volts to a voltage $-V_y$ for a half clock period. All other switches are open for quarter periods 0 and 1.

Continuing to refer to FIG. 1 and FIG. 2, during quarter period 2 switch S1 connecting the first transconductor 10 to the operational amplifier 11 is open, and switch S2 connecting the sample and hold capacitor C2 to the output of the operational amplifier 11 is closed allowing capacitor C2 to be charged up to a voltage equal to that on capacitor C1. Switches S4a and S4b remain closed. Switch S6 is closed to discharge the voltage on the parasitic capacitance at the output of the transconductor 10. All other switches are open during quarter period 2.

Continuing to refer to FIG. 1 and FIG. 2, during quarter period 3 switch S0 is closed to discharge the voltage on the feed back capacitor C1. Switch S5a is closed to connect input voltage $k_2 V_R$ to the input of the transconductor 10 and switch S5b is closed to connect a voltage reference $-V_R$ to the (+) input terminal of the current summing operational amplifier 11. Switch S6 remains closed to discharge the voltage on the parasitic capacitance at the output of the transconductor 10. All other switches are open during quarter period 3.

Continuing to refer to FIG. 1 and FIG. 2, during quarter periods 4 and 5 switches S1, S5a and S5b are closed, and all other switches are open. The feedback capacitor C1 is charged for one half clock period by the output of the transconductor 10 from the reference voltage $-V_R$ to a voltage $-V_y$. During quarter period 6 switches S5a and S5b remain closed and S3 is closed allowing a voltage equal to that on capacitor C1 to be put onto capacitor C3. Switch S6 is closed to discharge the capacitance on the parasitic capacitance at the output of the transconductor 10, and all other switches are open.

Continuing to refer to FIG. 1 and FIG. 2, during quarter period 7 switch S0 is closed to discharge capacitor C1. Switch 54a is closed to connect voltage $k_1 V_R$ to the input of the transconductor 10 and switch S4b is closed to connect circuit ground to the (+) input terminal of the current summing operational amplifier 11. Switch S6 remains closed to discharge the parasitic capacitance at the output of the transconductor 10, and all other switches are open. During quarter periods 8 and 9 switch S1 is closed connecting the output of the transconductor 10 to the (−)input of the operational amplifier 11, and switches S4a and S4b remain closed. Capacitor C1 in the feedback of operational amplifier 11 is charged from zero volts to a voltage $-V_y$ by the output current of the transconductor 10 similar to quarter periods 0 and 1. All other switches are open during quarter periods 8 and 9.

Continuing to refer to FIG. 1 and FIG. 2, a waveform for the voltage $V_x$ at the output of the operational amplifier 11 is shown in FIG. 2. In the first two clock periods 0 and 1 the voltage falls linearly from zero volts to $-V_y$ as the voltage on capacitor C1 is integrated by the current from the output of the transconductor 10. In quarter period 2 the voltage at the output of the operational amplifier 11 is held at the final charge level $-V_y$ of capacitor C1. During quarter period 3 the feedback capacitor C1 is discharged and the output of the operational amplifier 11 returns to $-V_R$ from $-V_y$. In quarter periods 4 and 5 the voltage on the feed back capacitor C1 is again integrated producing a linear fall of the voltage at the output of the operational amplifier 11 from $-V_R$ to $-V_y$. During quarter period 6 the voltage at the output of the operational amplifier is held constant, and in quarter period 7 the output of the operational amplifier again returns to zero volts as the feedback capacitor is discharged and the (+) terminal of the operational amplifier is connected to ground. The voltage $V_{D1}$ on capacitor C2 and the voltage $V_{D2}$ on capacitor C3 are controlled by the negative feedback of the circuit of FIG. 1 to be constant equal value $-V_y$. this is the same voltage which is held on capacitor C1 in quarter periods 2 and 6.

Continuing to refer to FIG. 1 and FIG. 2, the voltages $V_{D1}=V_{D2}=V_x$ where $$V_{D1} = \frac{gm}{C}k_1 V_R \frac{T}{2} + \frac{I_{off}}{C}\frac{T}{2} - V_{off} \text{ and}$$

$$V_{D2} = \frac{gm}{C}k_2 V_R \frac{T}{2} + \frac{I_{off}}{C}\frac{T}{2} - V_{off} - V_R.$$

transconductance of the transconductor 10 is gm, C is the capacitance of the capacitor C1, $k_1 V_R$ and $k_2 V_R$ are the input voltages to the transconductor 10, T is the period of the clock, $I_{off}$ is the offset current at the output of the first transconductor 10, and $V_{off}$ is the input offset voltage of the operational amplifier. Setting $V_{D1}$ equal to $V_{D2}$ yields $C/gm=(k_1-k_2)T/2$, or the time constant of the circuit $C/gm$ is proportional to the time that the capacitor C1 is charged by the output current of the transconductor 10. This charging period is one half of a clock period, T.

Figure 3:
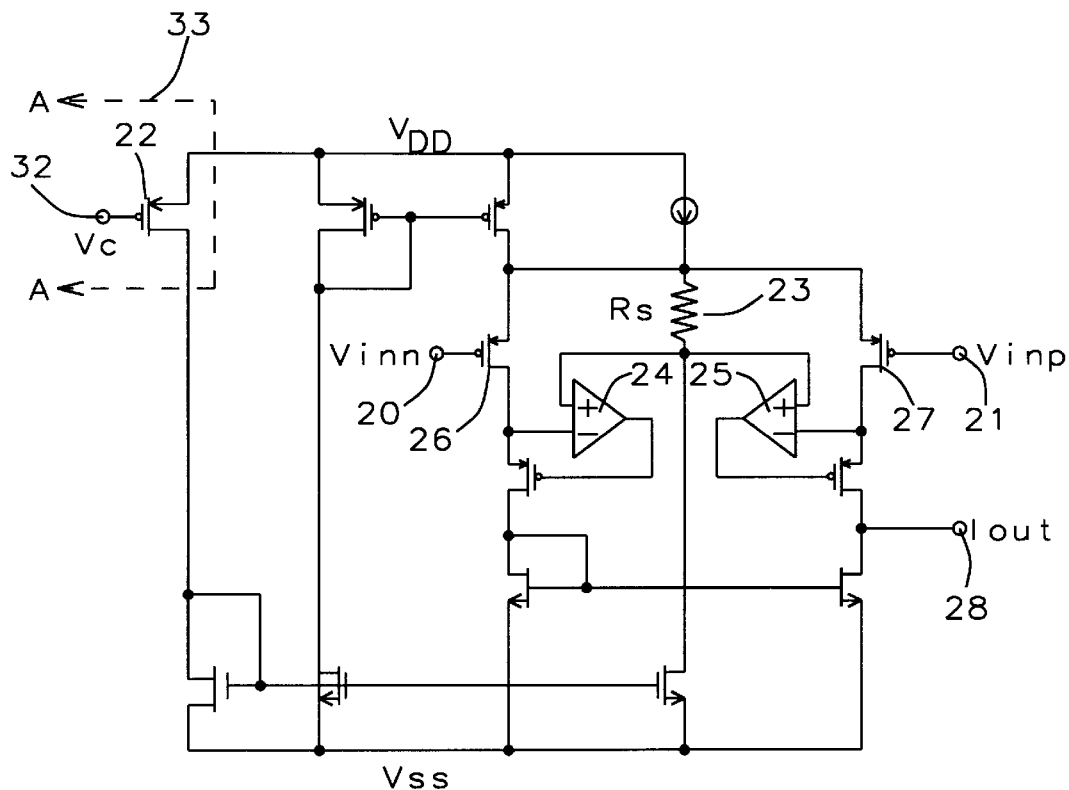
FIG. 3 is a schematic diagram of the first transconductor.

In FIG. 3 is shown a circuit schematic of transconductor 10 of FIG. 1. The circuit for the transconductor is shown connected between two voltage rails, $V_{DD}$ and $V_{SS}$. Vinn 20 is the negative input to the transconductor and Vinp 21 is the positive input. A PMOS transistor 22 forms a part of a current mirror 33 with circuitry in FIG. 4. A control voltage input $V_C$ 32 controls the current through the resistor $R_S$ 23. The voltage across $R_S$ 23 is used as a reference by the two differential amplifiers 24 25. These two differential amplifiers 24 25 control the drain-source voltages of the differential input transistors 26 27 to be the same as the voltage across $R_S$ 23. When the drain to source voltages of the two differential input transistors 26 27 are small with respect to the respective gate to source voltages minus the threshold voltage, the input transistors operate in a region where the transconductance of the transistors is proportional to the drain-source voltage and the output 28 is a current proportional to the transconductance.

Figure 4:
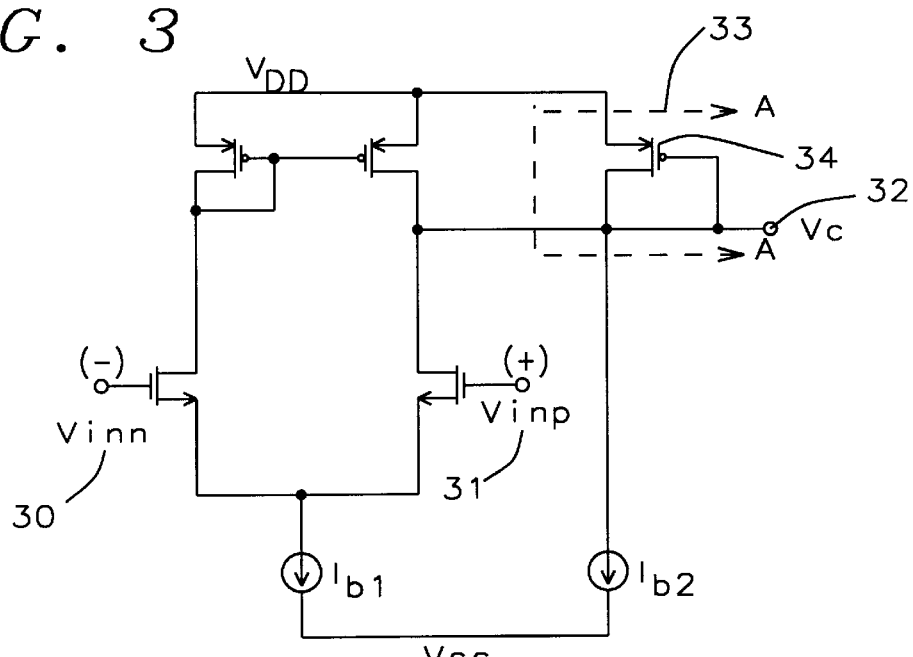
FIG. 4 is a schematic diagram of the second transconductor.

In FIG. 4 is shown a circuit schematic of the feed back transconductor 12 of FIG. 1. The circuit is biased between $V_{DD}$ and $V_{SS}$ and has a positive input (+) 31 and a negative input (−) 30. The output is a voltage $V_C$ 32 that is the gate and drain voltage of a PMOS transistor 34 of the current mirror 33. The remainder of the current mirror 33 is shown in FIG. 3. The current mirror is formed between the PMOS transistor 34 in FIG. 4 with gate and drain voltage $V_C$ and the PMOS transistor 22 in FIG. 3 with the gate voltage $V_C$.

Continuing to refer to FIG. 4, in filter tuning applications, $V_C$ is used to tune the transconductance of transconductors in other filters that have the same structure and characteristics as the first transconductor 10, and thereby adjusting the cutoff frequency in these filters. Since the feedback loop of the time constant circuit of FIG. 1 can be open at certain times, the transconductor circuit of FIG. 4 provides better loop stability than a high gain differential voltage amplifier used in other similar time constant tuning circuits.

Figure 5A:
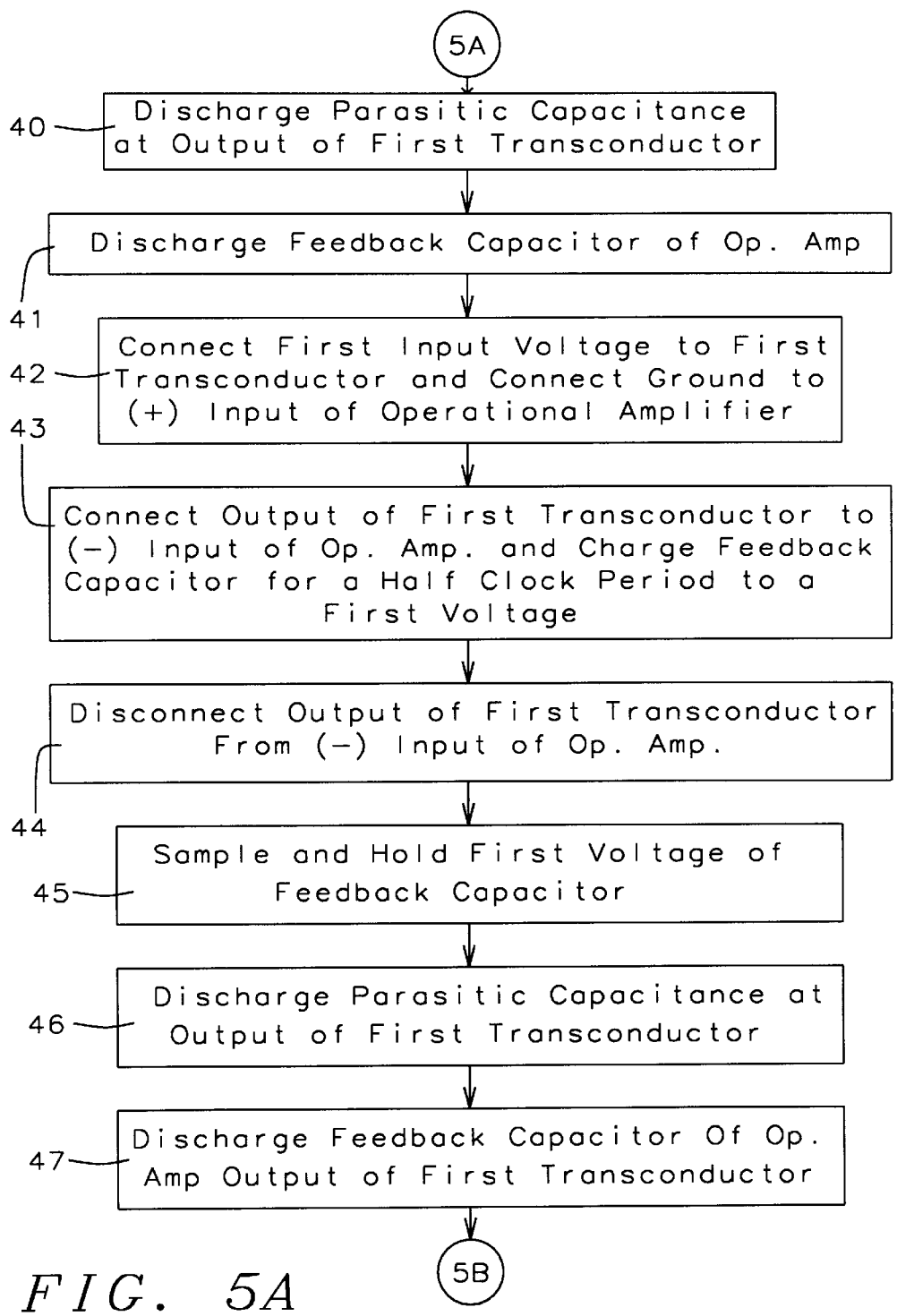
FIGS. 5a, 5b and 5c are flow diagrams of the method of tuning the time constant of the circuit.
Figure 5B:
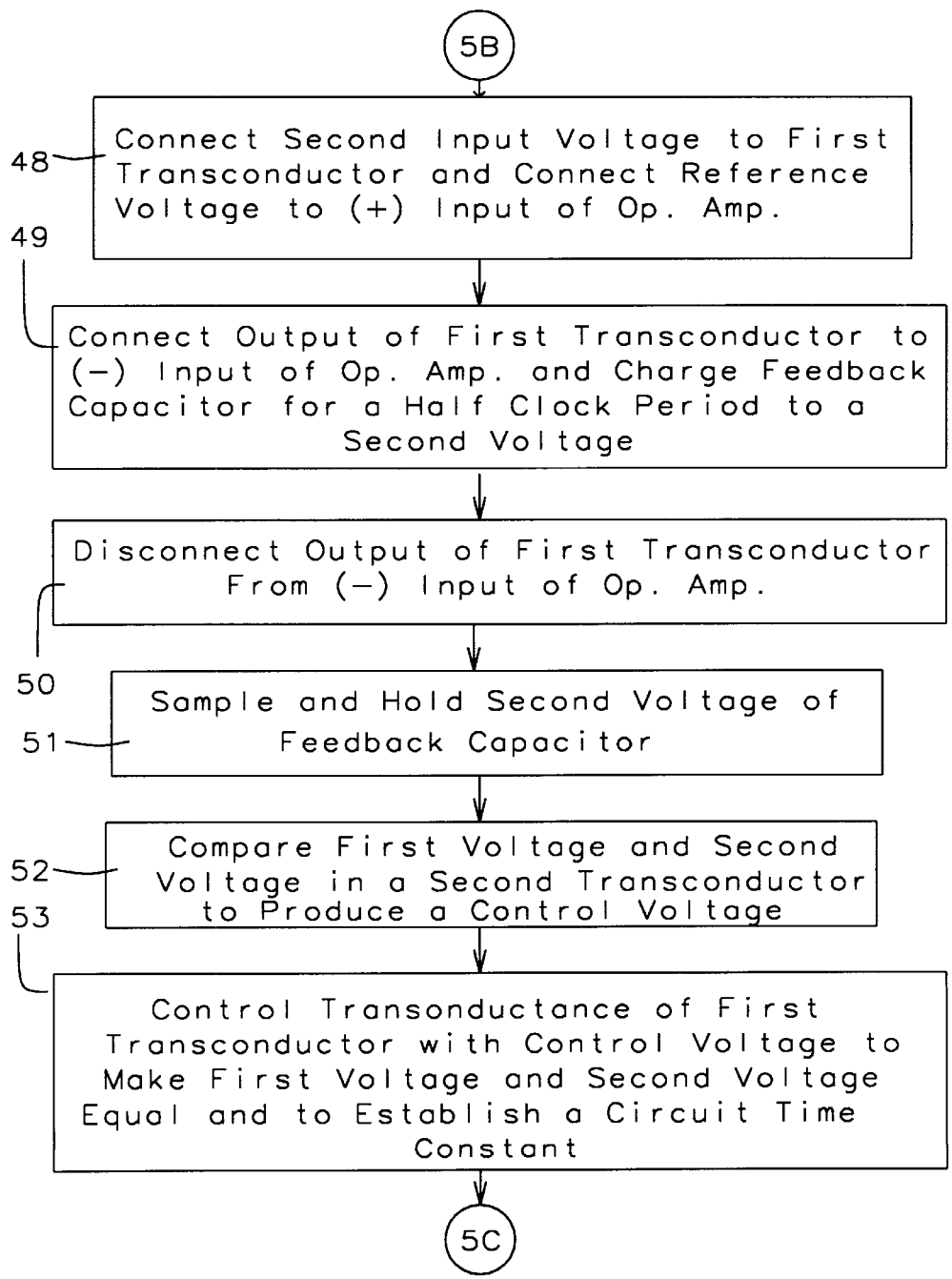
Figure 5C:
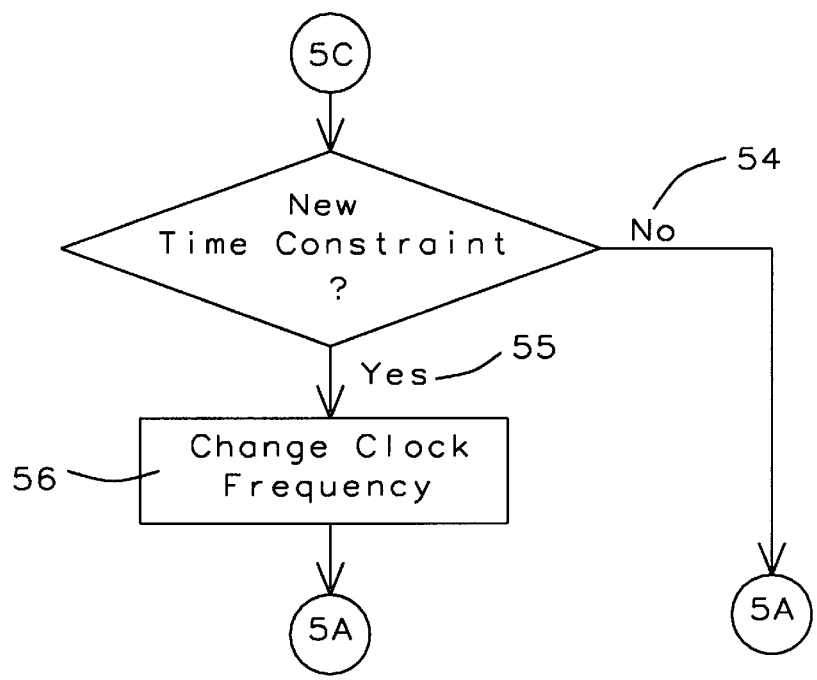

Shown in FIGS. 5a, 5b and 5c is a method for time constant tuning. The parasitic capacitance at the output of a first transconductor is discharged 40 and the feedback capacitor of an operational amplifier connected to the transconductor is discharged 41. A first voltage is connected to the input of the first transconductor and ground is connected to the (+) input of the operational amplifier (op. amp.) 42. The output of the first transconductor is connected to the (−) input of the operational amplifier for half a clock period to charge the feedback capacitor 43 to a first voltage by integrating the voltage on the capacitor with the current from the transconductor. The output of the transconductor is next disconnected from the operational amplifier 44 and the first voltage is held on the feed back capacitor. The first voltage of the feedback capacitor is sampled and held 45 by a second capacitor connected to the output of the operational amplifier. Then the parasitic capacitance at the output of the first transconductor is again discharged 46 and the feedback capacitor of the operational amplifier is discharged 47. A second voltage is connected to the input of the first transconductor and a reference voltage is connected to the (+) terminal of the operational amplifier 48. The output of first transconductor is again connected to the (−) input of the operational amplifier and the operational amplifier feedback capacitor is again charged for half a clock period to a second voltage 49. The first transconductor output is disconnected from the (−) input of the operational amplifier 50, and the second voltage on the feedback capacitor is sampled and held by a third capacitor connected to the output of the operational amplifier 51. The first voltage and the second voltage of the feedback capacitor are compared in a second transconductor 52 to produce a control voltage. The transconductance of the first transconductor is controlled by the control voltage of the second transconductor to make the first voltage and the second voltage of the feedback capacitor to be equal and in turn establish the time constant of the circuit 53. If a new time constant is not desired 54, the process starts over with the discharge of the parasitic capacitance at the output of the first transconductor 40. If a new circuit time constant is required 55, the clock frequency is changed 56 changing the charging time for the feedback capacitor. This leads to a change in the transconductance of the first transconductor to produce a different current to charge the feedback capacitor during the new half clock period. The process starts all over again at a new clock frequency with the parasitic capacitance at the output of the first transconductor being discharged 40.

Figure 6:
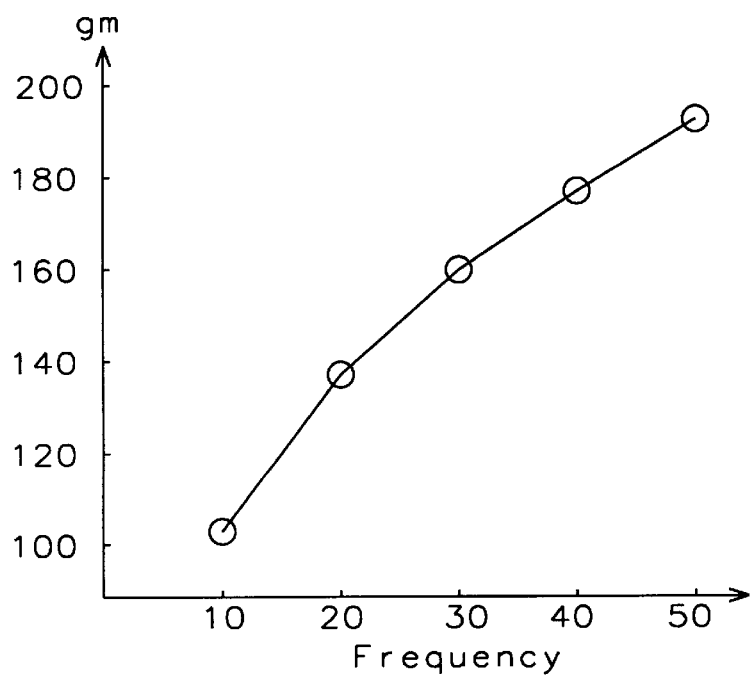
FIG. 6 is a graph that shows how transconductance changes with changing frequency.

In FIG. 6 is shown a plot of transconductance (gm) versus clock frequency in kHz. The plot shows a monotonic increase in gm for an increase in frequency from 10 to 50 kHz. Since the time constant of the circuit is $C/gm$, the time constant of the circuit is decreased as the frequency of the clock is increased.

While the invention has been particularly shown and described with reference to preferred embodiments thereof, it will be understood by those skilled in the art that various changes in form and details may be made without departing from the spirit and scope of the invention.

What is claimed is:

1. A time constant tuning circuit, comprising:
   a) a transconductance and a capacitance establishing a time constant of a circuit,
   b) said transconductance producing a first output current from a first transconductor proportional to a first input voltage in a first period of a clock,
   c) said transconductance producing a second output current from said first transconductor proportional to a second input voltage in a second period of said clock,
   d) said first output current charging said capacitor from zero volts to a first capacitor voltage during said first clock period,
   e) said second output current charging said capacitor from a reference voltage to a second capacitor voltage during said second clock period,
   f) said first capacitor voltage and said second capacitor voltage compared in a second transconductor to produce a control signal to control said transconductance of said first transconductor to make said first capacitor voltage and said second capacitor voltage equal
   g) said time constant of said circuit changed by changing frequency of said clock.

2. The circuit of claim 1, wherein voltage on parasitic circuit capacitance at output of said transconductor is discharged prior to charging said first capacitor voltage and said second capacitor voltage to eliminate a source of error.

3. The circuit of claim 1, wherein said reference voltage is connected between ground and the time constant tuning circuit by a switch prior to said second clock period.

4. The circuit of claim 1, wherein voltage on said capacitor is reset to an initial voltage before being charged by current from said transconductor, comprising:
   a) said capacitor reset to zero volts prior to said first clock period,
   b) said capacitor reset to said reference voltage prior to said second clock period.

5. A circuit for tuning a time constant, comprising:
   a) a first transconductor with a first input voltage connected by a first input switch and a second input voltage connected by a second input switch,
   b) a first output current produced by said first transconductor resulting from the first input voltage and a second output current produced by said first transconductor resulting from the second input voltage,
   c) a negative input of a current summing operational amplifier connected to output of said first transconductor through a first output switch,
   d) a second output switch connected to the output of said first transconductor to discharge parasitic circuit capacitance to ground,
   e) a feedback capacitor connected as negative feedback on said current summing operational amplifier,
   f) a feedback switch connected across said feedback capacitor to reset said feedback capacitor to an initial voltage,
   g) circuit ground connected to the positive input terminal of said current summing operational amplifier by a first reference switch,
   h) a reference voltage connected to the positive input terminal of said current summing operational amplifier by a second reference switch,
   i) a first sample and hold capacitor connected to output of said current summing operational amplifier by a first sample and hold switch,
   j) a second sample and hold capacitor connected to output of said current summing operational amplifier by a second sample and hold switch,
   k) said first sample and hold capacitor connected to a negative input of a second transconductor,
   l) said second sample and hold capacitor connected to a positive input of said second transconductor,
   m) output of said second transconductor connected to a transconductance control of said first transconductor,
   n) a switch control to control selection of all switches.

6. The circuit of claim 5, wherein the second output switch is controlled to be turned on and then back off while the first output switch is off.

7. The circuit of claim 5, wherein the first input switch and the first reference switch are controlled together, and the second input switch and the second reference switch are controlled together.

8. The circuit of claim 5, wherein the first sample and hold capacitor is connected to the output of the current summing operational amplifier after the feedback capacitor has been charged by said first output current of the first transconductor, and the second sample and hold capacitor is connected to the output of the current summing operational amplifier after the feedback capacitor has been charged by said second output current of the first transconductor.

9. The circuit of claim 5, wherein the voltage on the first sample and hold capacitor is controlled to be the same as the voltage on the second sample and hold capacitor by adjusting the transconductance of the first transconductor with the output from the second transconductor.

10. A method of circuit time constant tuning, comprising:
   a) connecting a first input voltage to a first transconductor and connecting ground to a (+) input of an operational amplifier,
   b) discharging parasitic capacitance at output of said first transconductor,
   c) discharging operational amplifier feedback capacitor,
   d) connecting output of first transconductor to (−) input of operational amplifier and charging said feedback capacitor for one half clock period to a first voltage,
   e) disconnecting output of first transconductor from (−) input of operational amplifier,
   f) sampling and holding said first voltage of said feedback capacitor,
   g) connecting a second input voltage to said first transconductor and connecting a reference voltage to said (+) input of the operational amplifier,
   h) discharging parasitic capacitance at output of said first transconductor,
   i) discharging operational amplifier feedback capacitor,
   j) connecting output of said first transconductor to said (−) input of operational amplifier and charging said feedback capacitor for one half clock period to a second voltage,
   k) disconnecting output of first transconductor from (−) input of operational amplifier,
   l) sampling and holding said second voltage of said feedback capacitor, m) comparing said first voltage and said second voltage in a second transconductor to produce a control voltage, n) controlling transconductance of said first transconductor with said control voltage to make said first voltage and said second voltage equal and to establish a circuit time constant, o) looping back to step "a" to maintain circuit time constant, p) changing frequency of said clock to set a new circuit time constant and looping back to step "a" to create and maintain new circuit time constant.

11. The method of claim 10, wherein applying said control voltage to other transconductors in a gm-C filter adjusts the gm-C filter cutoff frequency where said other transconductors have similar structure as said first transconductor.

* * * * *